United States Patent
Ruf et al.

(10) Patent No.: US 7,420,841 B2
(45) Date of Patent: Sep. 2, 2008

(54) MEMORY DEVICE AND METHOD FOR TRANSFORMING BETWEEN NON-POWER-OF-2 LEVELS OF MULTILEVEL MEMORY CELLS AND 2-LEVEL DATA BITS

(75) Inventors: Bernhard Ruf, Sauerlach (DE); Michael Angerbauer, Freutsmoos (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/468,465

(22) Filed: Aug. 30, 2006

(65) Prior Publication Data

US 2008/0055987 A1    Mar. 6, 2008

(51) Int. Cl.
G11C 29/52    (2006.01)

(52) U.S. Cl. ............................. 365/185.09; 365/185.03; 365/185.22

(58) Field of Classification Search ............ 365/185.03, 365/185.09, 185.22, 185.33
See application file for complete search history.

(56) References Cited

U.S. PATENT DOCUMENTS

| | | | |
|---|---|---|---|
| 3,716,852 A * | 2/1973 | Sawai | 341/56 |
| 6,401,193 B1 * | 6/2002 | Afsar et al. | 712/207 |
| 6,530,058 B1 | 3/2003 | Visconti | 714/773 |
| 6,847,550 B2 | 1/2005 | Park | 365/185.03 |
| 6,975,536 B2 * | 12/2005 | Maayan et al. | 365/185.16 |
| 7,017,099 B2 | 3/2006 | Micheloni et al. | 714/752 |
| 2002/0054505 A1 | 5/2002 | Micheloni et al. | 365/185.03 |
| 2007/0171697 A1 * | 7/2007 | Hoenigschmid et al. | 365/148 |
| 2007/0206402 A1 * | 9/2007 | Liaw et al. | 365/148 |

FOREIGN PATENT DOCUMENTS

WO    WO 0157876 A2 *    8/2001

* cited by examiner

Primary Examiner—Andrew Q Tran
(74) Attorney, Agent, or Firm—Dicke, Billig & Czaja, PLLC

(57) ABSTRACT

A memory device and a method of operating a memory device is disclosed. In one embodiment of the invention, the memory device includes a plurality of multi-level memory cells each having a number m of levels not matching $2^n$ with n being a non-zero integer, and a circuit or device for combining the levels of at least two of the memory cells for write and read operations into a set of combined states and for transforming at least a subset of $2^n$ combinations of the set of combined states into n two-level data bits.

19 Claims, 5 Drawing Sheets

| CELL1 | CELL0 | C3 | C2 | C1 | C0 | D<2> | D<1> | D<0> |
|---|---|---|---|---|---|---|---|---|
| L0 | L0 | 0, red | 0 | 0, red | 0 | 0 | 0 | 0 |
| L0 | L1 | 0, red | 0 | 0 | 1 | 0 | 0 | 1 |
| L0 | L2 | 0, red | 0 | 1 | 1, red | 0 | 1 | 0 |
| L1 | L0 | 0 | 1 | 0, red | 0 | 0 | 1 | 1 |
| L1 | L1 | 0 | 1 | 0 | 1 | 1 | 0 | 0 |
| L1 | L2 | 0 | 1 | 1 | 1, red | 1 | 0 | 1 |
| L2 | L0 | 1 | 1, red | 0, red | 0 | 1 | 1 | 0 |
| L2 | L1 | 1 | 1, red | 0 | 1 | 1 | 1 | 1 |
| L2 | L2 | 1 | 1, red | 1 | 1, red |  |  |  |

FIG 4

MEMORY DEVICE AND METHOD FOR TRANSFORMING BETWEEN NON-POWER-OF-2 LEVELS OF MULTILEVEL MEMORY CELLS AND 2-LEVEL DATA BITS

BACKGROUND

The invention provides a memory device, in particular to a non-volatile, resistively switching memory device such as a Phase Change Random Access Memory ("PCRAM"), Conductive Bridging Random Access Memories ("CBRAMs"), and a Magnetoresistive Random Access Memory ("MRAM"). The invention further relates to a method of operating a memory device, in particular a resistively switching memory device.

In the case of conventional memory devices, in particular conventional semiconductor memory devices, one differentiates between functional memory devices (e.g., PLAs, PALs, etc.), and table memory devices, e.g., ROM devices (ROM=Read Only Memory—in particular PROMs, EPROMs, EEPROMs, flash memories, etc.), and RAM devices (RAM=Random Access Memory—in particular e.g., DRAMs and SRAMs).

A RAM device is a memory for storing data under a predetermined address and for reading out the data under this address later. In the case of SRAMs (SRAM=Static Random Access Memory), the individual memory cells consist e.g., of few, for instance 6, transistors, and in the case of DRAMs (DRAM=Dynamic Random Access Memory) in general only of one single, correspondingly controlled capacitive element.

Furthermore, "resistive" or "resistively switching" memory devices have also become known recently, e.g., Phase Change Random Access Memories ("PCRAMs"), Conductive Bridging Random Access Memories ("CBRAMs"), Magnetoresistive Random Access Memories ("MRAM") etc., etc.

In the case of "resistive" or "resistively switching" memory devices, an "active" or "switching active" material—which is, for instance, positioned between two appropriate electrodes—is placed, by appropriate switching processes, in a more or less conductive state (wherein e.g., the more conductive state corresponds to a stored logic "One", and the less conductive state to a stored logic "Zero", or vice versa).

In the case of Phase Change Random Access Memories (PCRAMs), for instance, an appropriate chalcogenide or chalcogenide compound material may be used as a "switching active" material (e.g., a Ge—Sb—Te ("GST") or an Ag—In—Sb—Te compound material, etc.). The chalcogenide compound material is adapted to be placed in an amorphous, i.e. a relatively weakly conductive, or a crystalline, i.e. a relatively strongly conductive state by appropriate switching processes (wherein e.g., the relatively strongly conductive state may correspond to a stored logic "One", and the relatively weakly conductive state may correspond to a stored logic "Zero", or vice versa). Phase change memory cells are, for instance, known from G. Wicker, "Nonvolatile, High Density, High Performance Phase Change Memory", SPIE Conference on Electronics and Structures for MEMS, Vol. 3891, Queensland, 2, 1999, and e.g., from Y. N. Hwang et al., "Completely CMOS Compatible Phase Change Nonvolatile RAM Using NMOS Cell Transistors", IEEE Proceedings of the Nonvolatile Semiconductor Memory Workshop, Monterey, 91, 2003, S. Lai et al., "OUM-a 180 nm nonvolatile memory cell element technology for stand alone and embedded applications", IEDM 2001, Y. Ha et al., "An edge contact type cell for phase change RAM featuring very low power consumption", VLSI 2003, H. Horii et al., "A novel cell technology using N-doped GeSbTe films for phase change RAM", VLSI 2003, Y. Hwang et al., "Full integration and reliability evaluation of phase-change RAM based on 0.24 μm-CMOS technologies", VLSI 2003, and S. Ahn et al., "Highly Manufacturable High Density Phase Change Memory of 64 Mb and beyond", IEDM 2004, etc.

In the case of the above Conductive Bridging Random Access Memories (CBRAMs), the storing of data is performed by use of a switching mechanism based on the statistical bridging of multiple metal rich precipitates in the "switching active" material. Upon application of a write pulse (positive pulse) to two respective electrodes in contact with the "switching active" material, the precipitates grow in density until they eventually touch each other, forming a conductive bridge through the "switching active" material, which results in a high-conductive state of the respective CBRAM memory cell. By applying a negative pulse to the respective electrodes, this process can be reversed, hence switching the CBRAM memory cell back in its low-conductive state. Such memory components are e.g., disclosed in Y. Hirose, H. Hirose, J. Appl. Phys. 47, 2767 (1975), T. Kawaguchi et. al., "Optical, electrical and structural properties of amorphous Ag—Ge—S and Ag—Ge—Se films and comparison of photoinduced and thermally induced phenomena of both systems", J. Appl. Phys. 79 (12), 9096, 1996, M. Kawasaki et. al., "Ionic conductivity of Agx(GeSe3)1-x (0<x0.571) glasses", Solid State Ionics 123, 259, 1999, etc.

Correspondingly similar as is the case for the above PCRAMs, for CBRAM memory cells an appropriate chalcogenide or chalcogenid compound (for instance GeSe, GeS, AgSe, CuS, etc.) may be used as "switching active" material.

In the case of PCRAMs, in order to achieve, with a corresponding PCRAM memory cell, a change from the above-mentioned amorphous, i.e. a relatively weakly conductive state of the switching active material, to the above-mentioned crystalline, i.e. a relatively strongly conductive state of the switching active material, an appropriate relatively high heating current pulse has to be applied to the electrodes, the heating current pulse resulting in that the switching active material is heated beyond the crystallization temperature and crystallizes ("writing process").

Vice versa, a change of state of the switching active material from the crystalline, i.e. a relatively strongly conductive state, to the amorphous, i.e. a relatively weakly conductive state, may, for instance, be achieved in that—again by means of an appropriate (relatively high) heating current pulse—the switching active material is heated beyond the melting temperature and is subsequently "quenched" to an amorphous state by quick cooling ("erasing process").

Typically, the above erase or write heating current pulses are provided via respective source lines and bit lines, and respective FET or bipolar access transistors associated with the respective memory cells, and controlled via respective word lines.

As the above, typically a switching of one cell between two states ("high" and "low", or "zero" and "one") is performed. In fact, all commercially available computer systems employ this scheme. Still, it is possible for resistively switching memory device that each cell may have more that two states (so called 'multi-level technologies'). In the following, to apply common notation, memory cells with a number i of possible distinct states are called i-level memory cells. Memory cells with four levels per cell are described in DE 3531580 A1 and EP 007 28 45 A2. However, in these documents, the four levels of this cell are used to be mapped to a common ('digital') two-state logic which is comparatively easy because of the same power base of 2.

A practical problem is that it is not always possible to practically realize $2^n$ being a non-zero integer) levels of a cell because, e.g., of a too small sense margin or too small a write margin which prevents reliably sensing or writing, resp., these states.

This, up to now, gives a situation that a cell having three usable levels/states (e.g., a fourth level/state cannot be reliably used because of a too small sense margin and/or a too small a write margin) will only use two of these levels because three levels cannot be matched to the usual logic of base 2. Thus, the potential of the third level is unused what leads to a waste of silicon area. In general, this problem occurs for all cells with a number of levels that are not to the base of 2, e.g., 3, 5, 6, 7, 9 etc.

There exist a need to be able to use memory cells with a number of levels that are not to the base of 2.

For these and other reasons, there is a need for the present invention.

SUMMARY

In one embodiment, the invention provides a memory device having a plurality of multi-level memory cells each having a respective number of levels not matching $2^n$, with n being a non-zero integer, and a circuit or device for combining the levels of at least two of the memory cells into a set of combined states and for transforming between at least a subset of $2^n$ combinations of the set of combined states and corresponding states of n two-level data bits. This is especially useful for at least one of write and read operations, in the respective direction.

It is generally not necessary that the number m of the levels is equal for all multi-level cells. The transforming into n two-level data bits may be performed on a logical level such that the combined states of the multi-level cells may be sensed and/or read as states/combinations of states of n two-level data bits, or vice versa. Also, surplus states not being transformed, can be used otherwise or be left unused. Even if the surplus states are left unused, the percentage of unused states is much smaller than the percentage of unused states of single cells having a number of levels not matching a base of 2, i.e., m being not equal to $2^n$ with n a non-zero integer. This gives a much better usage of silicon space. This usage increases on average if the surplus states are used otherwise.

According to another embodiment of the invention, a method for operating a memory device is provided, wherein the memory device comprises combining the levels of at least two of the multi-level memory cells for write and/or read operations into a set of combined states; and transforming between at least a subset of $2^n$ combinations of the set of combined states and states of n two-level data bits. These steps can be arranged in either order, depending, e.g., on the performed operation; or be performed at the same time.

These and other embodiments are particular useful using resistively switching memory devices such as Phase Change Random Access Memories ("PCRAM"), Conductive Bridging Random Access Memories ("CBRAMs"), and a Magnetoresistive Random Access Memories ("MRAM") or other types of non-volatile memory.

BRIEF DESCRIPTION OF THE DRAWINGS

The accompanying schematic drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

FIG. 4 schematically illustrates an encoder logic for reading multi-level cells in accordance with an embodiment of the present invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
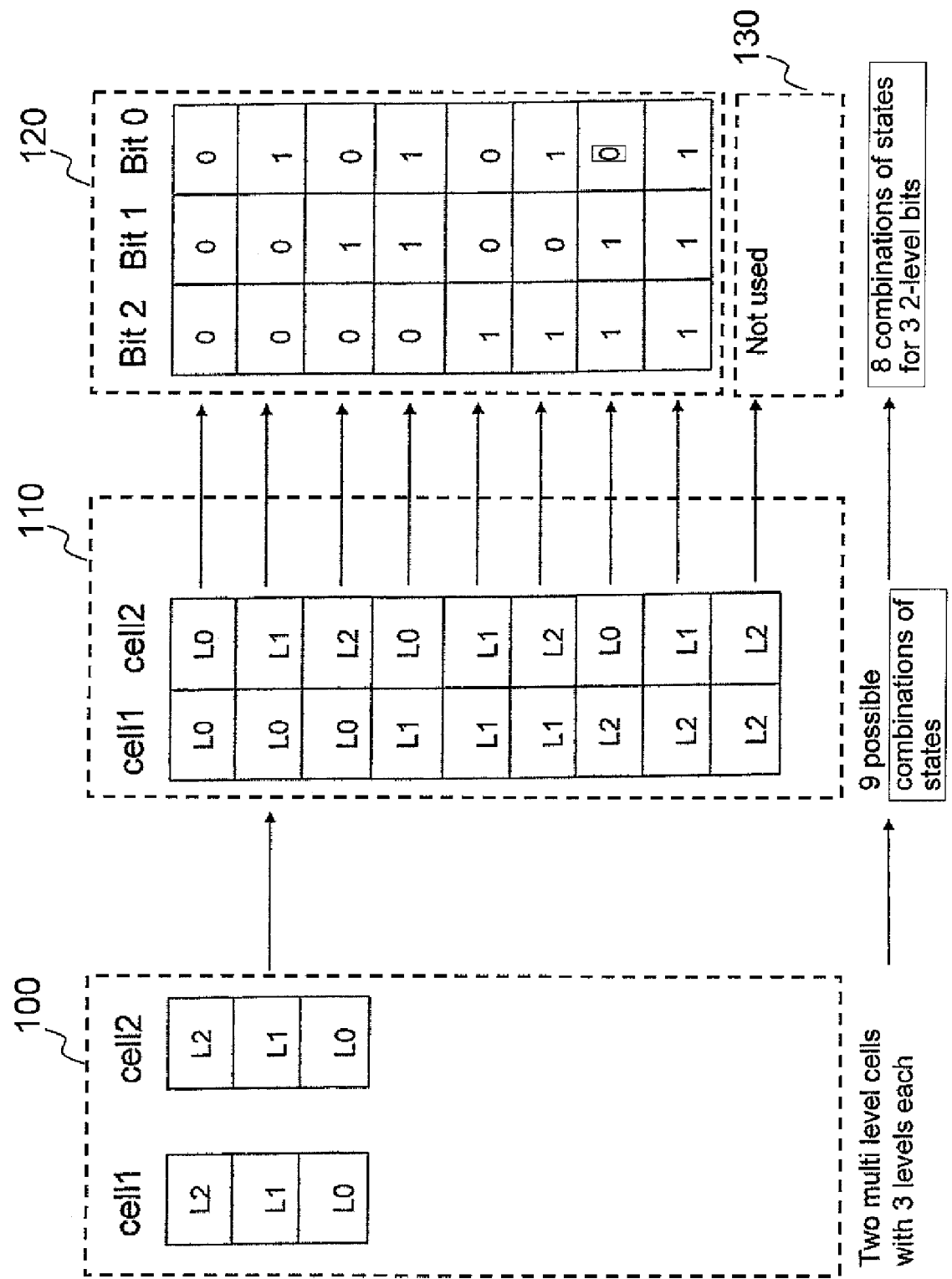
FIG. 1 illustrates a schematic logical combination and transformation of states of multi-level cells into states of two-level data bits in accordance with an embodiment of the present invention.

FIG. 1 illustrates, from left to right, a schematic logical combination and transformation of states of two multi-level bits each having m=3 levels into states of two-level data bits.

In the left dashed block 100, a plurality of two multi-level memory cells cell1, cell2 are illustrated that each have a number of m=3 levels L0, L1, L2.

Combining these levels L0, L1, L2 of the two multi-level memory cells cell1, cell 2 into a set of combined states gives 9 possible combined states (L0, L0), . . . , (L2, L2), as illustrated in block 110.

In block 120, a subset of $8=2^3$ combinations (L0, L0), . . . , (L2, L2) of the set of 9 combined states is transformed (or mapped) into the equivalent of the combined states (0, 0, 0), . . . , (1, 1, 1) of 3 two-level data bits.

Consequently, $3^2-2^3=1$ state (L2, L2) of the set of the initial 9 combined states (L0, L0), . . . , (L2, L2) is not transformed (or mapped) into the equivalent of a state of 3 two-level data bits, as illustrated in block 130. This state can be used for other purposes, or left unused.

This drawing illustrates the advantage over the prior art technology since it can use 8 different (combined) states of the two multi-level memory cells cell1, cell2, while the prior art methods would have left the third state/level L2 of the multi-level cells cell1, cell2 unused, leading to only 4 used combined states. The invention thus illustrates a doubled efficiency regarding the use of states and thus the use of silicon area.

Figure 2:
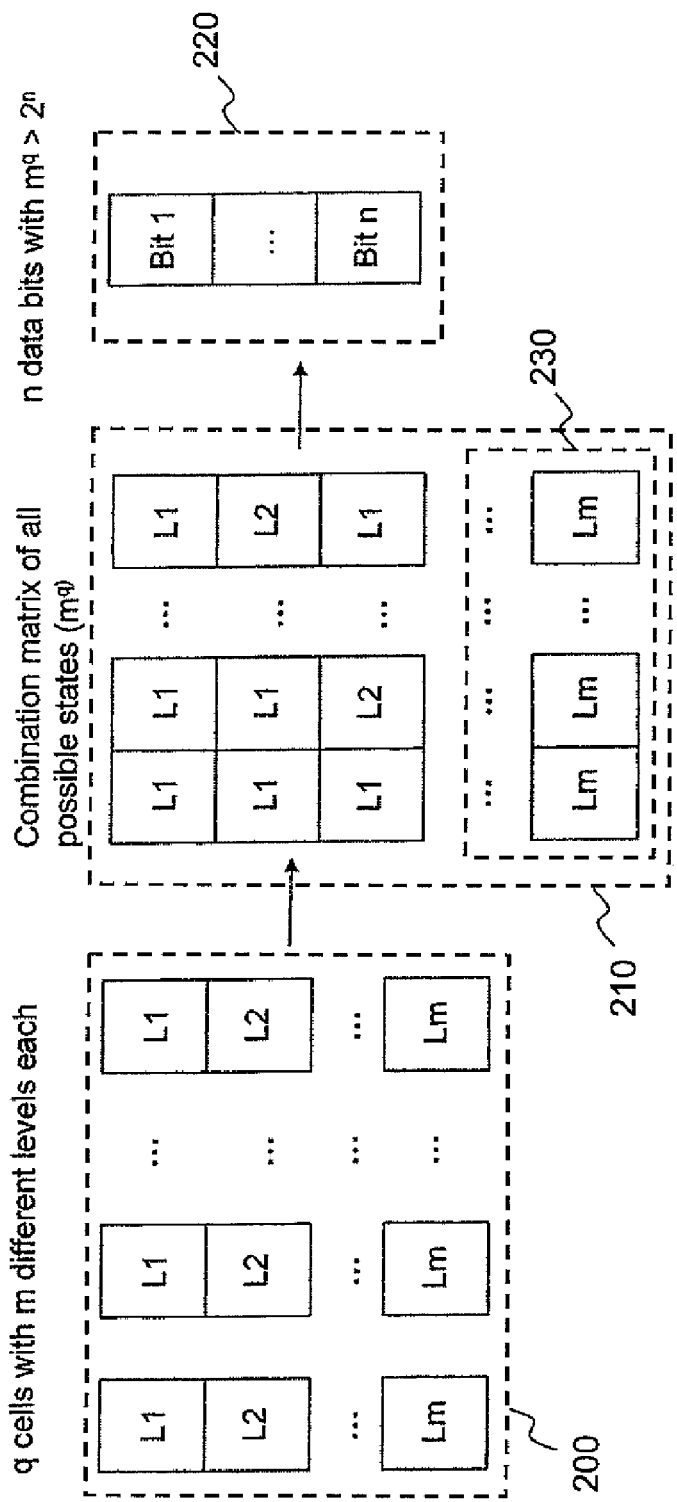
FIG. 2 illustrates a generalized schematic logical combination and transformation of states of multi-level cells into states of two-level data bits in accordance with another embodiment of the present invention.

FIG. 2 illustrates a generalized schematic logical combination and transformation of states of q multi-level cells having m levels each into $2^n$ states of n two-level data bits in accordance with another embodiment of the present invention.

This embodiment of FIG. 2, although similar to the embodiment of FIG. 1, is not restricted to 2 multi-level cells but is concerned with any suitable number of q cells. Also, the number m of states/levels per cell is not restricted to m=3 levels but is concerned with any suitable number of m levels with m≠$2^n$, with n being a non-zero integer.

In the left dashed block 200, a plurality of q multi-level memory cells are illustrated that each have a number of m levels L1, ..., Lm.

Combining these levels L1, ..., Lm of the q multi-level memory cells into a set ('matrix') of combined states gives $m^q$ possible combined states (L1, ..., L1), ..., (Lm, ..., Lm), as illustrated in block 210.

In block 220, a subset of combinations of the set of $M^q$ combined states is transformed (or mapped) into the equivalent of the combined states of n two-level data bits.

Some ($m^q-2^n$) states of the set of the initial combined states (L1, ..., L1), ..., (Lm, ..., Lm), are not transformed (or mapped) into the equivalent of states of n two-level data bits, as illustrated in block 230. These states can be used for other purposes, or left unused.

Figure 3:
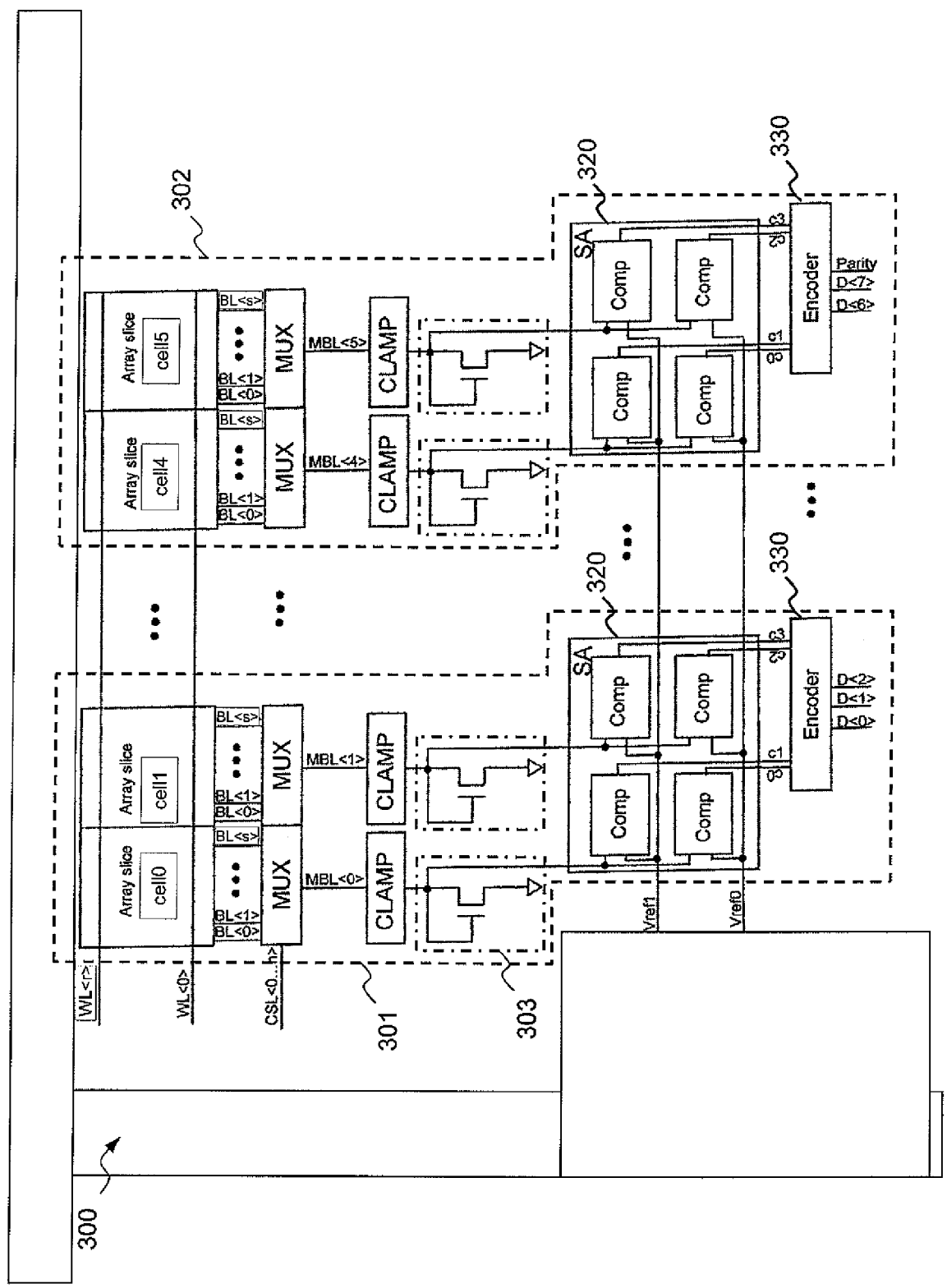
FIG. 3 schematically illustrates a read circuit for reading multi-level cells in accordance with an embodiment of the present invention.

FIG. 3 schematically illustrates a read circuit schematic for reading 6 three-level cells in accordance with an embodiment of the present invention.

A read circuit 300 is comprised of identical read circuit subsets 301, 302 of which, for reasons of clarity only, only two of three are illustrated. An intermediate read circuit subset is omitted in the drawing but functions similarly.

The illustrated read circuit subsets 301, 302 each comprise a means for combining levels/states of two memory cells cell0, cell1 and cell4, cell5, resp., into a set of combined states and for transforming this set of combined states at least partially into states of 3 two-level data bits, as will be detailed further below.

Each read circuit subset 301, 302 comprises two 3-level PCRAM-memory cells cell0, cell1, ..., cell4, cell5. Each cell cell0, cell1, ..., cell4, cell5 is part of a respective array slice of (r·s) cells each, with r, s being positive integers. Since only one cell of each array slice can be addressed at one time, one cell of each (r·s) cell array slice is chosen as a representative cell cell0, cell1, ..., cell4, cell5 for the read circuit 300. These array slices are connected to the same word lines WL<0:r> and to identically arranged but respectively different bit lines BL<0:s>. The bit lines BL<0:s> associated with array slice, resp., are connected to a multiplexer MUX each. To address this cell, the respective word line out of the set of word lines WL<0:r> and the respective bit line out of the set of bit lines BL<0:s> is activated. Of course, the cells cell0, ..., cell5 of the read circuit 300 do not need to have the same position in (r,s). The operation and addressing of PCRAM memory cells, and of volatile and non-volatile memory cells and array slices as such is known to the one skilled in the art.

To direct signals to and from the respective cells cell0, ..., cell5, the respective multiplexer connects the correct bit line out of the set of bit lines BL<0:s> to one master bit line MBL<0>, ..., MBL<5> per multiplexer MUX that, in turn, is connected to the respective other components. Selection of a connection between a respective master bit line MBL<0>, ..., MBL<5> and the correct bit line out of the set of bit lines BL<0:s> is established by switching each multiplexer by a respective control signal CSL<0:s>. The operation of a multiplexer as such is known to the one skilled in the art.

In this embodiment, the master bit lines MBL<0:5> are each connected to a clamp circuit CLAMP that is responsible for a voltage drop according to a read voltage over the associated cell. Each clamp circuit CLAMP is in turn connected with a switching circuit 303, e.g. a NFET in a diode circuit, to convert the reading current of the associated cell cell0, cell1, ..., cell4, cell5, resp., into a voltage that is fed into a sensing amplifier 320.

In the sensing amplifier 320, which in this embodiment is a double sensing amplifier 320 for one circuit subset 301, 302, each voltage output from the clamp circuit CLAMP is compared to two different reference voltages Vref0, Vref1 to determine its level, e.g., being (i) above the higher reference voltage, (ii) between the reference voltages, and (iii) below the lower reference voltage. The operation of a sensing amplifier as such as such is known to the one skilled in the art.

Thus, each sensing amplifier 320 creates four output signals c<0:3> that are fed into a corresponding encoder 330. Each encoder 320 in turn generates 3 (two-level) bits from the SA output signals c<0:3>. The operation of an encoder as such is known to the one skilled in the art.

Therefore, in the illustrated read circuit 300 having three read circuit subsets 301, 302, nine (3 times 3) states of common two-level data bits are generated from only six three-level cells. These nine data bits may be arranged such that they constitute a data byte of 8 data bits D<0 ... 8> and 1 parity bit. This corresponds to read circuit 300 having nine output bit lines used as parity encoded byte line.

For the purpose of error correction, generally all suitable error detection and/or error correction codes can be used. The usable error detection and/or error correction method also depends on the number of bits unused as data bits.

The easiest method comprises the additional transfer and storage of a so-called 'parity bit' as a check bit.

For example, in the case of an 'even' parity, the additionally transferred parity bit set to 'zero', if the number of bits of value "1" of the other transferred bits is even, and to 'one', if the number of bits of value "1" of the other transferred bits is uneven.

In the case of an 'uneven' parity, the additionally transferred parity bit is set to 'one', if the number of bits of value "1" of the other transferred bits is even, and to 'zero', if the number of bits of value "1" of the other transferred bits is uneven.

For error detection, the parity bit is stored alongside the other transferred (data) bits.

When reading the data bits, the parity bit of the read data bits is calculated and compared to the stored parity bit. If there is a difference between these parity bits, an error has occured.

If several bits are defective, an uneven number of errors can be detected but not an even number of errors.

By transferring several check bit instead of only one check bit above mentioned principle can be improved such that errors not only can be detected but also localized and/or an even number of errors can be detected. A localized error can be corrected.

One possible error correction code is the Hamming Code.

Depending on the code and the number of check bits, the number of detectable and/or correctable errors may be different. One possible code for error detection and correction is the SECDED (Single Error Correction, Dual Error Detection) code.

FIG. 4 schematically illustrates an encoder logic of encoder 330 of FIG. 3 for reading multi-level cells in accordance with an embodiment of the present invention.

The table illustrated in FIG. 4 illustrates the logic values of cells cell0, cell1, output signals c<0:.3>, and data bits D<0:2> of the first read circuit subset Encoder circuit 330 may be encoded using at least one of NAND, AND, OR, and NOR logic circuits.

The table illustrates that some output signals c<0...3> are redundant, e.g., if cell has stored the lowest or the highest level, as indicated.

One set of possible Boole operations to map output signals c<0...3> to data bits D<0...2> is illustrated below:

$$D<0> = \overline{C}_1 \wedge C_0 \wedge (\overline{C}_2 \vee C_3) \vee \overline{C}_3 \wedge C_2 \wedge (\overline{C}_0 \vee C_1)$$

$$D<1> = C_3 \vee C_1 \wedge C_0 \vee \overline{C}_1 \wedge \overline{C}_0$$

$$D<2> = C_2 \wedge C_0 \vee C_3)$$

Figure 5:
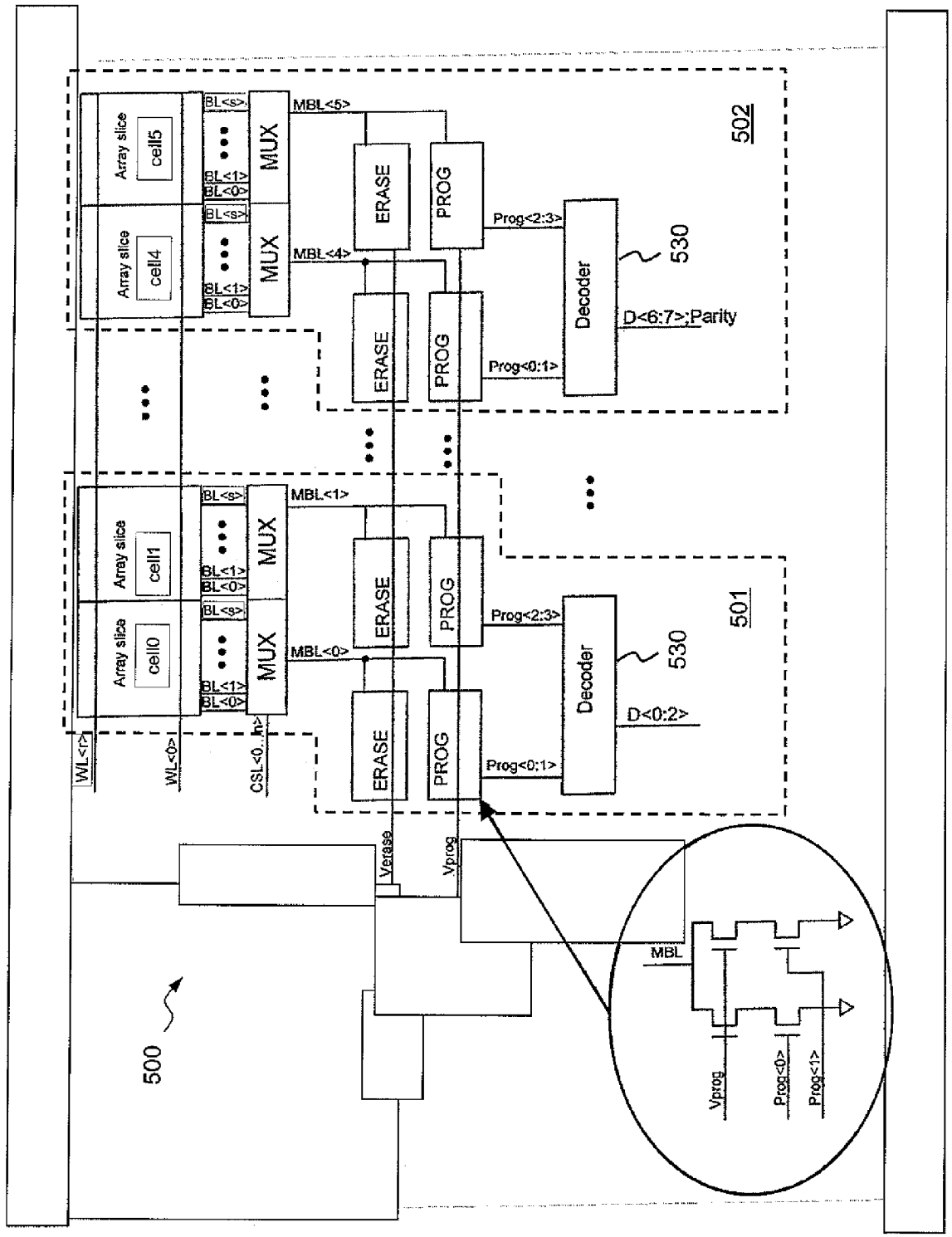
FIG. 5 schematically illustrates a write circuit for writing multi-level cells in accordance with an embodiment of the present invention.

FIG. 5 schematically illustrates a write circuit 500 for writing multi-level cells in accordance with an embodiment of the present invention.

The write circuit 500 is comprised of identical write circuit subsets 301, 302 of which, for reasons of clarity only, only two of three are illustrated. An intermediate, identical write circuit subset is omitted in the drawing for reasons of clarity only.

The illustrated write circuit subsets 501, 502 are each a means for transforming the (combined) states of 3 two-level data bits into a into a set of combined states of two 3-level memory cells cell0, cell1 and cell4, cell5, resp., and for writing this set of combined states of the two 3-level memory cells cell0, cell1 and cell4, cell5, resp., into the correct states/levels of the respective 3-level memory cells cell0, cell1, cell4, cell5, as will be detailed further below.

Each write circuit subset 501, 502 includes two 3-level PCRAM-memory cells cell0, cell1, ..., cell4, cell5 Each cell is part of a respective array slice of (r·s) cells each, with r, s being positive integers. Since only one cell of each array slice can be addressed at one time, one cell of each (r·s) cell array slice is chosen as a respresenative cell for the write circuit 500. These array slices are connected to the same word lines WL<0:r> and identically arranged but different bit lines BL<0, ..., s>.

The bit lines BL<0:s> associated with array slice, resp., are connected to a multiplexer MUX each. To address this cell, the respective word line out of the set of word lines WL<0:r> and the respective bit line out of the set of bit lines BL<0:s> is activated. Of course, the cells cell0, ..., cell5 of the write circuit 500 do not need to have the same position in (r,s).

To direct signals to and from the respective cells cell0, ..., cell5, the respective multiplexer connects the correct bit line out of the set of bit lines BL<0:s> to one master bit line MBL<0>, ..., MBL<5> per multiplexer MUX that, in turn, is connected to the respective other components. Selection of a connection between a respective master bit line MBL<0>, ..., MBL<5> and the correct bit line out of the set of bit lines BL<0:s> is established by switching each multiplexer by a respective control signal CSL<0:s>.

In this embodiment, the master bit lines MBL<0:5> are each connected to a corresponding erase circuit ERASE and a corresponding programming circuit PROG. The programming circuits PROG of each write circuit subset 501, 502 are connected to one associated decoder 530 having a data bit input line D<0:2>, D<6, 7> and Parity, resp., as illustrated.

The writing of (two-level) data bits D<0:7>; Parity will be explained by the example of the first write circuit subset 501 although this is principally the same for all write circuit subsets 501, 502 of this embodiment.

Before writing data into the multi-level cells cell0, cell1 of the first write circuit subset 501, the cells are erased by applying an erase voltage Verase to the erase circuit ERASE that, in turn, applies an erasing pulse of appropriate time and form to the cells via the multiplexer MUX. This erase voltage sets the respective cell to a state of, e.g., logical 'zero'.

To write—in this exemplary description regarding first write circuit subset 501—three digital data bits D<0:2> into the two three-level cells cell0, cell1, the states of the three data bits D<0:2> are decoded into matching states of the three-level cells cell0, cell1 by the decoder 530, as described further below. The decoder 530 splits its programming output signal into two part corresponding to one of the cells each, i.e., Prog<0:1> and Prog <2:3>, resp.

The decoder 530 may be implemented with at least one of NAND, AND, OR, and NOR logic circuits. Respectively encoded Boole functions may be as follows:

$$Prog<0> = D<0> \wedge (\overline{D}<1> \wedge D<2>) \vee \overline{D}<0> \wedge (D<1> \\ \wedge \overline{D}<2> \vee D<2> \wedge \overline{D}<1>)$$

$$Prog<1> = D<0> \wedge \overline{D}<1> \wedge \overline{D}<2> \vee \overline{D}<0> \wedge D<1> \\ \wedge D<2>$$

$$Prog<2> = D<2> \vee D<0> \wedge D<1> \wedge \overline{D}<2>$$

$$Prog<3> = D<2> \wedge D<1>$$

The programming circuit PROG is illustrated in more detail within the circle on the left side. This illustrates that the respective output signals Prog<0:1> and Prog <2:3> (also called C<0:1> and C<2:3>) of the decoder 530 are mapped to one of the appropriate three levels of the respective three-level cell by the following process: if a logic state of "zero" has to be written, no programming is needed since the cell is already in that state thanks to the erase process described above. If two higher levels have to be written, these can be set by mapping the programming signals Prog<0> and Prog <1> to an appropriate voltage or current level for writing the two higher states, as illustrated. To initiate the writing process, the programming circuit PROG is fed by a programming voltage Vprog. The appropriate writing current or voltage is then applied to the respective cell via the correctly switched multiplexer MUX such that the appropriate bit line BL<0:s> is active. Writing a PCRAM cell on the correct level using bit lines BL<0:s> and word lines WL<0:r> is finally performed based on the input data bits D<0:2>.

The read circuit 300 of FIG. 3 and the write circuit 500 of FIG. 5 may preferably be implemented as one read/write circuit since they used the same cells cell0, ..., cell5 with the same associated bit lines BL<0:n> and word lines WL<0:m>. As such they may share, e.g., the same multiplexer MUX for read and write operations. Accordingly, such a multiplexer MUX may preferably be part of the read/write circuit. Also, the encoder 330 and the decoder 530 may be implemented into an integral encoding/decoding circuit etc. An implementation can be practiced by hardware, software or a combination thereof.

For example, the memory device may utilize more or less than 6 multi-level cells combined into a common read/write circuit. Also the resulting data bits may not utilize parity. Multi-level cells with more than 3 levels may be used, e.g., with m=5, 6, 7, 9 etc.

Also, other kinds of memory cells may be use instead the ones based a PCRAM technology. For example, other resistively switching memory cells like CBRAM memory cells or MRAM memory cells may be used. Further, other non-volatile memory cells may be used such as based on flash technology or any other suitable technology like, for example, ferro electric RAM (FRAM, FeRAM), Chalcogenide RAM (C-RAM), Ovonic Unified Memory (OUM), Programmable Metallization Cell (PMC), Organic RAM (ORAM) and/or Nanotube RAM (NRAM) etc. Further, the invention is not restricted to non-volatile memory cells but also comprises volatile multi-level cells with a number of levels other than to a base of two.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device, comprising:
    a read or write circuit including a plurality of circuit subsets, each circuit subset comprising a plurality of multi-level memory cells each having a number of levels not matching $2^n$ with n being an integer; and
    a first circuit configured for combining the levels of at least two of the memory cells into a set of combined states and for transforming between at least a subset of $2^n$ combinations of the set of combined states and states of n two-level data bits to apply at least one of the two-level data bits for at least one of error detection and error correction.

2. The memory device of claim 1, wherein all multi-level memory cells have the same number m of levels.

3. The memory device of claim 2, wherein the number m of levels is three.

4. The memory device of claim 3, wherein six multi-level memory cells together correspond to 9 two-level data bits.

5. The memory device of claim 1, wherein the plurality of multi-level memory cells are non-volatile memory cells.

6. The memory device of claim 1, wherein the first circuit is adapted for read operations.

7. The memory device of claim 1, wherein the first circuit is adapted for at least a write operation.

8. The memory device of claim 1, wherein the first circuit includes one or more logic devices.

9. A method for operating a memory device having a plurality of multi-level memory cells each in turn having a number of levels not matching $2^n$ with n being a non-zero integer, the method comprising:
    combining the levels of at least two of the memory cells into a set of combined states; and
    transforming between at least a subset of $2^n$ combinations of the set of combined states and n two-level data bits to apply at least one of the two-level data bits for at least one of error detection and error correction.

10. The method of claim 9, wherein all multi-level memory cells have the same number m of levels.

11. The method of claim 10, wherein the number m of levels is three.

12. The method of claim 11, wherein six multi-level memory cells together correspond to 9 two-level data bits.

13. The method of claim 9, wherein the plurality of multi-level memory cells are non-volatile memory cells.

14. A resistively switching memory device, comprising:
    a read or write circuit including a plurality of circuit subsets, each circuit subset comprising a plurality of multi-level memory cells each having a number of levels not matching $2^n$ with n being an integer; and
    a circuit configured for combining the levels of at least two of the memory cells into a set of combined states and for transforming between at least a subset of $2^n$ combinations of the set of combined states and states of n two-level data bits to apply at least one of the two-level data bits for at least one of error detection and error correction.

15. The memory device of claim 14, wherein all multi-level memory cells have the same number m of levels, wherein the number m of levels is three, and wherein six multi-level memory cells together correspond to 9 two-level data bits.

16. The memory device of claim 14, wherein the plurality of multi-level memory cells are phase change random access memory cells.

17. The memory device of claim 14, wherein the plurality of multi-level memory cells are conductive bridging random access memory cells.

18. The memory device of claim 14, wherein the plurality of multi-level memory cells are magnetoresistive random access memory cells.

19. A memory device, comprising:
    a read or write circuit including a plurality of circuit subsets, each circuit subset comprising a plurality of multi-level memory cells each having a number of levels not matching $2^n$ with n being an integer; and
    means for combining the levels of at least two of the memory cells into a set of combined states and for transforming between at least a subset of $2^n$ combinations of the set of combined states and states of n two-level data bits to apply at least one of the two-level data bits for at least one of error detection and error correction.

* * * * *